United States Patent
Tsai et al.

(10) Patent No.: US 6,399,408 B1
(45) Date of Patent: Jun. 4, 2002

(54) PROCESS FOR PRODUCING LIGHT EMITTING DEVICE

(75) Inventors: Tzong-Liang Tsai; Charng-Shyang Jong, both of Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 09/783,305

(22) Filed: Feb. 15, 2001

(30) Foreign Application Priority Data

Nov. 9, 2000 (TW) ........................................ 089123673

(51) Int. Cl.$^7$ ............................................... H01L 21/00
(52) U.S. Cl. ....................................................... 438/45
(58) Field of Search ............................. 438/22, 33, 42, 438/45, 46, 47, 462, 463, 507, 508, 509, 535, 795, 796, 797, 799, 940

(56) References Cited

U.S. PATENT DOCUMENTS

| 5,306,662 A | | 4/1994 | Nakamura et al. |
| 5,519,193 A | * | 5/1996 | Freiermuth et al. |

FOREIGN PATENT DOCUMENTS

JP            2001217199 A  *  8/2001

OTHER PUBLICATIONS

Antell et al., entitled "Passivation of Zinc Acceptors in InP by Atomic Hydrogen Coming from Arsine During Metalorganic Vapor Phase Epitaxy," Appl. Phys. Lett., vol. 53, Aug. 29, 1988, pp. 758–760.

Cole et al., entitled "Effect of Cooling Ambient on Electrical Activation of Dopants in MOVPE of InP," Electron. Lett., vol. 24, No. 15, Jul. 21, 1988, pp. 929–931.

Hamada et al., entitled "AlGaInP Visible Laser Diodes Grown on Misoriented Substrates," IEEE J. Quantum Electron., vol. 27, No. 6, Jun. 1991, pp. 1483–1490.

Akasaki et al., entitled "P–Type Conduction in Mg–Doped GaN Treated with Low–Energy Electron Beam Irradiation (LEEBI)," Japanese J. Appl. Phys., vol. 28, No. 12, Dec. 1989, pp. L2112–L2114.

* cited by examiner

Primary Examiner—Keith Christianson
(74) Attorney, Agent, or Firm—Greenblum & Bernstein, P.L.C.

(57) ABSTRACT

The present invention provides a process for effectively producing a high performance light emitting device. A substrate on which an N-type semiconductor layer, a light emitting layer, and a P-type semiconductor layer are formed is provided. The N-type semiconductor layer is cut to be discontinuous. Then the substrate is microwaved. Not only the present invention takes advantage of microwaving process for producing a high performance light emitting device, but also avoids the shortcoming of the device cracking due to over activation of the N-type semiconductor layer by microwave processing.

11 Claims, 2 Drawing Sheets

PROCESS FOR PRODUCING LIGHT EMITTING DEVICE

BACKGROUND OF THE INVENTION

1. Field of the Invention

The present invention relates to a process for producing a light emitting device and more particularly, to a process for effectively producing a high performance semiconductor light emitting device.

2. Description of Prior Art

For most semiconductor devices such as a light emitting diode (LED), a laser diode, a photodetector and a transistor, an N-type doped layer and a P-type doped layer are often required. However, it is very difficult for doping high concentration P-type dopant in III-V or II-VI group of compound semiconductor materials. Typical examples are like: doping magnesium in III-V group of compound semiconductors such as InP, AlGaInP and AlGaInN; and doping magnesium in II-VI group of compound semiconductors such as ZnSSe.

One of the main reasons for the difficulty in forming P-type conductivity is the unintentional hydrogen incorporation and consequent acceptor passivation during an epitaxial growth process and a cooling process thereof. This will retard the P-type dopant in the semiconductor materials from meeting the requirement of high concentration.

Many attempts are provided to solve this problem, e.g. Antell et al. (Appl. Phys. Lett., 53, 1988, 758), Cole et al. (Electron. Lett., 24, 1988, 929), Hamada et al. (IEEE J. Quantum Electron., 27, 1991, 1483), Akasaki et al. (Japanese J. Appl. Phys. 28, 1989, L2112), and Nakamura et al. (U.S. Pat. No. 5,306,662). However, the problem is not solved to a desirable extent. Therefore, the applicant of the present invention discloses a microwaving process that can effectively solve the above problem in the U.S. application Ser. No. 09/497,316 (Method of Manufacturing Low Resistivity P-type Compound Semiconductor Material, taking the priority advantage of Taiwan Patent Application No. 89101337).

However, the microwave energy will activate the semiconductor device, especially for the N-type layer therein. A large quantity of the microwave energy will be absorbed by the N-type layer and propagates therein. The excess microwave energy will result in the cracking of the device. Therefore, the microwave energy and processing time should be strictly controlled so as to avoid product failure. This is inconvenient for production and may cause problems.

Aiming to this, the present invention provides a process that takes advantage of a microwaving process and avoids the shortcoming of cracking during the microwaving process as well.

SUMMARY OF THE INVENTION

An objective of the present invention is to provide a process for effectively producing high performance light emitting device. The present invention can avoid the shortcoming of device cracking during a microwaving process and maintain the integrity of the device. The quality of the light emitting device can be further ensured and the production yield be enhanced.

In a preferred embodiment, the present invention provides a process for producing a light emitting device. Firstly, a substrate is provided. On the substrate an N-type semiconductor layer, a light emitting layer, and a P-type semiconductor layer are sequentially formed. Next, one or more layers on the substrate are cut to a depth. And lastly, the substrate is microwaved. The way of cutting can be accomplished by etching, mechanical cutting, electrical cutting or laser cutting.

Preferably, the cutting depth substantially reaches the substrate, including on a top surface and to a partial depth thereof, or reaches a partial depth of the N-type semiconductor layer. The light emitting device is preferably a light emitting diode.

In another preferred embodiment, the present invention provides another process for producing a light emitting device. Firstly, a substrate is provided. On the substrate a P-type semiconductor layer, a light emitting layer, and an N-type semiconductor layer are sequentially formed. Next, at least a layer on the substrate is cut to a depth. And lastly, the substrate is microwaved.

Preferably, the cutting depth substantially reaches a partial depth of the N-type semiconductor layer, or substantially reaches a top surface of the light emitting layer, or substantially reaches the substrate.

DETAILED DESCRIPTION OF THE INVENTION

Figure 1:
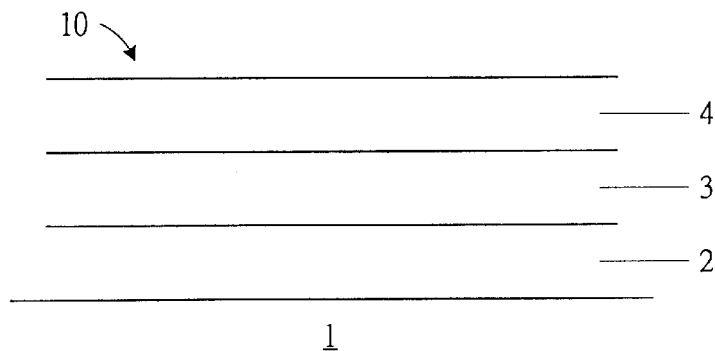
FIG. 1 illustrates a fundamental structure of a light emitting device.

Please refer to FIG. 1, which illustrates a fundamental structure of a light emitting device 10 before undertaking a cutting step of the present invention. Firstly, a substrate 1 is provided. An N-type semiconductor layer 2, a light emitting layer 3 and a P-type semiconductor layer 4 are sequentially formed on the substrate 1.

Figure 2:
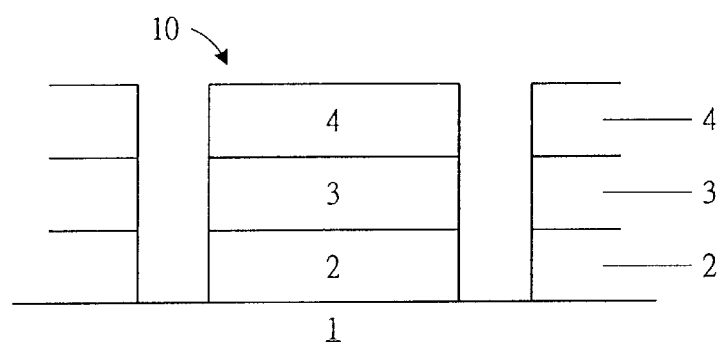
FIG. 2 illustrates a light emitting device according to the first preferred embodiment of the present invention.

Next, please refer to FIG. 2. The light emitting device 10 is cut. The cutting depth substantially reaches the substrate 1. The cutting depth, as understood, can either reach a top surface of the substrate 1 or can reach a partial depth of the substrate 1. This separates the N-type semiconductor layer 2 into several individual segments on the substrate 1. The N-type semiconductor layer 2 being divided into several discontinuous segments interrupts the propagation of a microwave energy applied in the later microwaving process. This further avoids cracking of the light emitting device 10 and product failure.

The way of cutting can be accomplished by etching, mechanical cutting, electrical cutting, laser cutting and any other ways known to persons skilled in the art, and should not be confined to its literal meaning such as mechanical cutting. Any techniques that separate the N-type semiconductor layer 2 into discontinuous segments can be well applied.

The light emitting device 10 is preferably a light emitting diode (LED), including a III-V group semiconductor compound LED and a II-VI group semiconductor compound LED, which can be easily deduced and implemented by persons skilled in the art.

Figure 3:
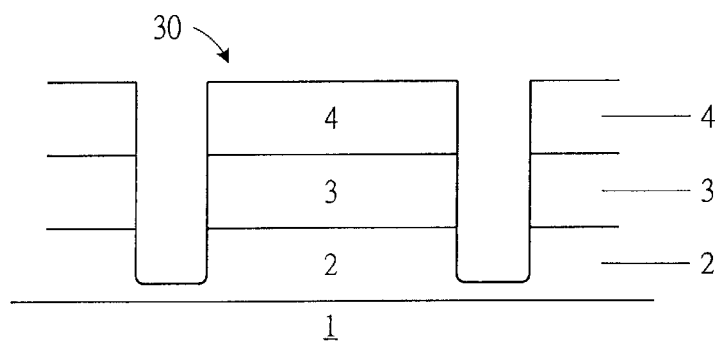
FIG. 3 illustrates a light emitting device according to the second preferred embodiment of the present invention.

Please refer to FIG. 3. In another preferred embodiment, the cutting depth reaches a partial depth of the N-type semiconductor layer 2 rather than the top surface of the substrate 1. This can also reduce the microwave energy propagation in the N-type semiconductor layer 2 and avoid cracking of a light emitting device 30.

Figure 4:
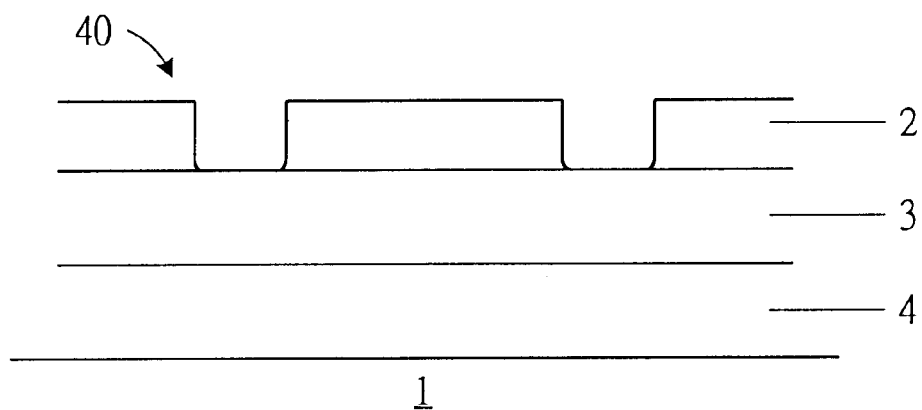
FIG. 4 illustrates a light emitting device according to the third preferred embodiment of the present invention.

Please refer to FIG. 4. In another preferred embodiment, a light emitting device 40 includes a substrate 1 on which a P-type semiconductor layer 4, a light emitting layer 3 and an N-type semiconductor layer 2 are sequentially formed. The cutting depth substantially reaches a top surface of the light emitting layer 3. Thus the N-type semiconductor layer 2 can be completely divided into a plurality of separate parts.

Figure 5:
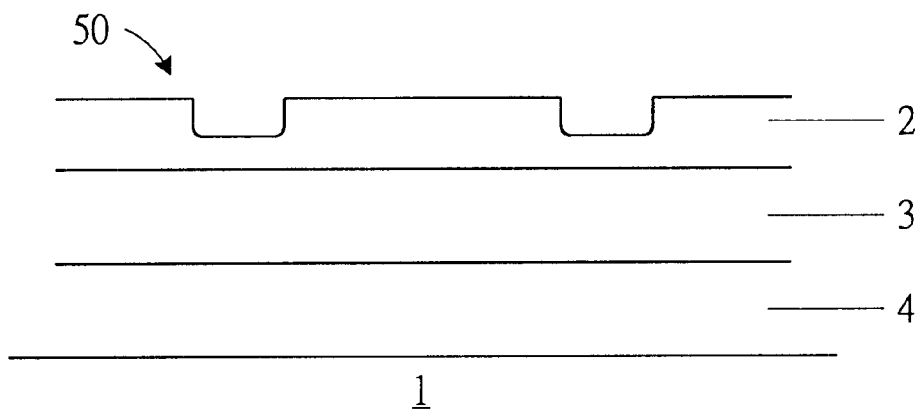
FIG. 5 illustrates a light emitting device according, to the fourth preferred embodiment of the present invention.

Please refer to FIG. 5. In another preferred embodiment, a light emitting device 50 has a basic structure like the light emitting device 40. The cutting depth reaches a partial depth of the N-type semiconductor layer 2. This can also reduce the microwave energy propagation and avoid cracking of the light emitting device 50.

A microwaving process follows the above cutting steps. The microwaving process enables the light emitting device to perform in a high quality, e.g. reducing the resistivity of the P-type semiconductor layer and increasing conductivity.

The subsequent process is well known to persons in the art. Electrodes are respectively deposited on the P-type and N-type semiconductor layers, 4 and 2. And the substrate 1 is cut into a plurality of light emitting device chips. Therefore, the light emitting device of the present invention refers to a wafer before division, a LED chip, and the final product of a packaged LED chip.

EXAMPLE 1

An epi-ready aluminum oxide substrate wafer is placed in a reactor. The wafer was purged by hydrogen gas for ten minutes at a temperature of 1150° C. The temperature of the substrate is then lowered to 510° C. and DMZn with a flow rate of 63 $\mu$ mol/min and $NH_3$ with a flow rate of $7.14 \times 10^{-2}$ mol/min are introduced to the reactor. Single crystal grains of zinc nitride are grown on the substrate with an average diameter of 0.2 $\mu$m and a density of about 107 $cm^{-2}$. The temperature are then increased to 1140° C. and TMG with a flow rate of $5.97 \times 10^{-5}$ mol/min and $NH_3$ with a flow rate of $1.34 \times 10^{-1}$ mol/min are introduced. A GaN epitaxy layer of about 1 $\mu$m thick is grown with a carrier concentration of 2 e16 $cm^{-3}$. $SiH_4$ with a flow rate of $1.77 \times 10^{-10}$ mol/min is further introduced to grow a 2.5 $\mu$m thick N-type Si-doped GaN layer. The carrier concentration of the N-type GaN layer is 2 e18 $cm^{-3}$.

All the reactive gas is then shut off. The temperature of the substrate is lowered to 820° C. and TMG with a flow rate of 8.61 $\mu$mol/min and TMIn with a flow rate of 4.73 $\mu$mol/min and $NH_3$ with a flow rate of 0.134 mol/min are introduced to the reactor. A light emitting layer with a multiple quantum well structure of 10 layers of InGaN/GaN is grown. All the reactive gas is then shut off. The temperature of the substrate is increased to 1110° C. and TMGa with a flow rate of 4.75 $\mu$mol/min and DGMg with a flow rate of $1.25 \times 10^{-7}$ mol/min and $NH_3$ with a flow rate of $8.93 \times 10^{-2}$ mol/min are introduced to the reactor. A 0.5 $\mu$m thick P-type Mg-doped layer is grown on the light emitting layer. An epitaxy growth of a light emitting diode structure is finished.

Then, the wafer is cut into a plurality of chip dice with a 305 $\mu$m×355 $\mu$m rectangular form by a diamond knife. The cutting depth reaches the 1 $\mu$m thick undoped GaN layer or even deeper reaches the substrate. The wafer, with rectangular chip dies thereon, is disposed in a microwaving processor. The wafer, particularly the P-type layer, is activated for one minute with a microwave power of 560 W and a frequency of 2.45 GHz. A forward voltage of the resultant light emitting diode is 3.2V at a current of 20 mA.

EXAMPLE 2

Forming a light emitting diode whose structure is the same with that in Example 1. The way of cutting is by reactive ion etching. The epitaxy wafer is etched to be a plurality of chip dice with a 305 $\mu$m×355 $\mu$m rectangular form. The etching depth reaches the 1 $\mu$m thick undoped GaN layer or even reaches the substrate. The P-type layer is then activated for 30 seconds with a microwave power of 400 W and a frequency of 15 GHz. A forward voltage of the resultant light emitting diode is 3.2V at a current of 20 mA.

EXAMPLE 3

An epi-ready aluminum oxide substrate wafer is placed in a reactor. The wafer was purged by hydrogen gas for ten minutes at a temperature of 1150° C. The temperature of the substrate is then lowered to 570° C. and TMG with a flow rate of 45 $\mu$mol/min and TMIn with a flow rate of 40 $\mu$mol/min and $NH_3$ with a flow rate of 31/min are introduced to the reactor. An InGaN crystal nucleus layer is grown. Then TMAl with a flow rate of 50 $\mu$mol/min and TMIn with a flow rate of 40 $\mu$mol/min and $NH_3$ with a flow rate of 31/min are introduced to form an AlInN crystal nucleus layer. Theses two crystal nucleus layers are about 50A thick in total. The temperature is then adjusted to 550° C. and TMG with a flow rate of 20 $\mu$mol/min and TMA with a flow rate of 25 $\mu$mol/min and $NH_3$ with a flow rate of $_{2.51}$/min are introduced to grown a 320A thick AlGaN dislocation inhibition layer. The temperature is then increased to 1130° C. and TMG with a flow rate of 52 $\mu$mol/min, $NH_3$ with a flow rate of 3.51/min are introduced to grow a 1 $\mu$m thick undoped GaN layer. A mixed gas of $SiH_4$ (100 ppm) and $H_2$ is further introduced to grow a 3 $\mu$m thick N-type Si-doped GaN layer. The carrier concentration of this layer is about $3 \times 10^{18}$ $cm^{-3}$.

Next, the temperature is lowered to 850° C. and TMG with a flow rate of 30 $\mu$mol/min and TMIn with a flow rate of 30 $\mu$mol/min and $NH_3$ with a flow rate of 3.51/min are introduced to grow a light emitting layer with a multiple quantum well structure of 5 pair layers of InGaN/GaN. The temperature of the substrate is then increased to 1100° C. and TMG with a flow rate of 42 $\mu$mol/min and TMAl with a flow rate of 20 $\mu$mol/min and $NH_3$ with a flow rate of 3.51/min and DCpMg with a flow rate of 52 nmol/min are introduced to grow a 0.1 $\mu$m thick P-type AlGaN cladding layer. The substrate temperature is increased to 1130° C. and TMG with a flow rate of 52 $\mu$mol/min and $NH_3$ with a flow rate of 3.51/min and DCpMg with a flow rate of 52 nmol/min are introduced to grow a 0.3 $\mu$m thick P-type GaN layer. An epitaxy growth of a light emitting diode structure is finished. Then, the wafer is etched into a plurality of chip dice with a 305 $\mu$m×355 $\mu$m rectangular form by electrical etching. The etching depth reaches the 1 $\mu$m thick undoped GaN layer or even deeper reaches the substrate. The P-type layer is then activated for three minutes with a microwave power of 600 W and a frequency of 1 GHz. A forward voltage of the resultant light emitting diode is 3.3V at a current of 20 mA.

EXAMPLE 4

Forming a light emitting diode whose structure is the same with that in Example 3.

The epitaxy wafer is etched to be a plurality of chip dice with a 500 μm×500 μm square form by reactive ion etching. The etching depth reaches the 1 μm thick undoped GaN layer or even reaches the substrate. The P-type layer is then activated for one minute with a microwave power of 400 W and a frequency of 145 GHz. A forward voltage of the resultant light emitting diode is 3.3V at a current of 20 mA.

EXAMPLE 5

An epi-ready aluminum oxide substrate wafer is placed in a reactor. The wafer was purged by hydrogen gas for ten minutes at a temperature of 1150° C. The temperature of the substrate is then lowered to 530° C. and TMA with a flow rate of 50 μmol/min and $NH_3$ with a flow rate of 2l/min are introduced to grow an AlN crystal nucleus layer. The temperature is then increased to 620° C. and TMIn with a flow rate of 55 μmol/min and $NH_3$ with a flow rate of 3l/min are introduced to grow an InN crystal nucleus layer. Theses two crystal nucleus layers are about 45 Å thick in total. The temperature is then lowered to 500° C. and TMG with a flow rate of 30 μmol/min and $NH_3$ with a flow rate of 2.5l/min are introduced to grown a 200 Å thick dislocation inhibition layer. The temperature is then increased to 1120° C. and TMG with a flow rate of 52 μmol/min and $NH_3$ with a flow rate of 3l/min are introduced to grow a 1 μm thick undoped GaN epitaxy layer. The carrier concentration of this layer is 2e16 $cm^{-3}$. Then DCpMg with a flow rate of 52 nmol/min is further introduced to grow a 2 μm thick P-type GaN layer.

Next, the substrate temperature is lowered to 820° C. and TMG with a flow rate of 30 μmol/min and TMIn with a flow rate of 30 μmol/min and $NH_3$ with a flow rate of 3.5l/min are introduced to grow a light emitting layer with a multiple quantum well structure of 10 pair layers of InGaN/GaN. The substrate temperature is then increased to 1130° C. and TMG with a flow rate of 52 μmol/min and $NH_3$ with a flow rate of 3l/min and a mixed gas of $SiH_4$(100 ppm) and $H_2$ are introduced to grow a 1 μm thick N-type GaN layer. An epitaxy growth of a light emitting diode structure is finished.

Then, the wafer is etched into a plurality of chip dice with a 500 μm×500 μm square form by laser cutting. The etching depth at least reaches below the N-type GaN layer. The P-type layer is then activated for two minutes with a microwave power of 550 W and a frequency of 50 GHz. A forward voltage of the resultant light emitting diode is 3.5V at a current of 20 mA.

The implementation and features of the present invention become more apparent through the above detailed description. It should be understood that any modifications and changes without departing from the spirit of the invention are intended to be protected.

What is claimed is:

1. A process for producing a light emitting device, comprising the steps of:
   (1) providing a substrate on which an N-type semiconductor layer, a light emitting layer, and a P-type semiconductor layer being sequentially formed;
   (2) cutting at least one layer on the substrate to a depth; and
   (3) microwaving the substrate.

2. The process of claim 1, wherein the depth substantially reaches the substrate.

3. The process of claim 1, wherein the depth substantially reaches a partial depth of the N-type semiconductor layer.

4. The process of claim 1, wherein the way of cutting is accomplished by etching, mechanical cutting, electrical cutting or laser cutting.

5. The process of claim 1, wherein the light emitting device is a light emitting diode.

6. A process for producing a light emitting device, comprising the steps of:
   (1) providing a substrate on which a P-type semiconductor layer, a light emitting layer, and an N-type semiconductor layer being sequentially formed;
   (2) cutting at least one layer on the substrate to a depth; and
   (3) microwaving the substrate.

7. The process of claim 6, wherein the depth substantially reaches a partial depth of the N-type semiconductor layer.

8. The process of claim 6, wherein the depth substantially reaches a top surface of the light emitting layer.

9. The process of claim 6, wherein the depth substantially reaches the substrate.

10. The process of claim 6, wherein the way of cutting is accomplished by etching, mechanical cutting, electrical cutting or laser cutting.

11. The process of claim 6, wherein the light emitting device is a light emitting diode.

* * * * *